(12) United States Patent
Shiobara et al.

(10) Patent No.: US 9,147,818 B2
(45) Date of Patent: Sep. 29, 2015

(54) WAVELENGTH CONVERSION SHEET FILLED WITH LARGE AMOUNT OF PHOSPHOR, METHOD OF PRODUCING LIGHT EMITTING SEMICONDUCTOR DEVICE USING THE SHEET, AND LIGHT EMITTING SEMICONDUCTOR DEVICE

(71) Applicant: Shin-Etsu Chemical Co., Ltd., Chiyoda-ku (JP)

(72) Inventors: Toshio Shiobara, Annaka (JP); Tsutomu Kashiwagi, Annaka (JP); Miyuki Wakao, Takasaki (JP)

(73) Assignee: Shin-Etsu Chemical Co., Ltd., Chiyoda-ku (JP)

( * ) Notice: Subject to any disclaimer, the term of this patent is extended or adjusted under 35 U.S.C. 154(b) by 306 days.

(21) Appl. No.: 13/671,080

(22) Filed: Nov. 7, 2012

(65) Prior Publication Data
US 2013/0113008 A1     May 9, 2013

(30) Foreign Application Priority Data
Nov. 7, 2011 (JP) .................................. 2011-243267

(51) Int. Cl.
*H01L 33/00* (2010.01)
*H01L 33/56* (2010.01)
(Continued)

(52) U.S. Cl.
CPC .............. *H01L 33/56* (2013.01); *C09D 183/04* (2013.01); *C09K 11/02* (2013.01);
(Continued)

(58) Field of Classification Search
CPC .................. H01L 2924/0002; H01L 2924/00; H01L 33/50; H01L 33/501; H01L 33/505; H01L 33/56

USPC .................................. 257/98; 438/27; 428/143
See application file for complete search history.

(56) References Cited

U.S. PATENT DOCUMENTS

| 7,737,635 B2 * | 6/2010 | Wang et al. .................... 313/512 |
| 2004/0094757 A1 | 5/2004 | Braune et al. |

(Continued)

FOREIGN PATENT DOCUMENTS

| EP | 1 873 211 A1 | 1/2008 |
| EP | 1 914 811 A1 | 4/2008 |

(Continued)

OTHER PUBLICATIONS

Office Action issued Feb. 12, 2014 in Japanese Patent Application No. 2011-243267 with English language translation.

(Continued)

*Primary Examiner* — Duy T Nguyen
(74) *Attorney, Agent, or Firm* — Oblon, McClelland, Maier & Neustadt, L.L.P.

(57) ABSTRACT

A wavelength conversion sheet filled with a large amount of phosphor, enabling the phosphor to be easily dispersed uniformly and in a large amount near the surface of an LED element. Specifically, the sheet includes: a layer formed from a heat-curable resin composition, which contains 100 parts by mass of a resin component and 100 to 2,000 parts by mass of a particulate phosphor in which the proportion of particles having a sphericity of 0.7 to 1.0 is not less than 60% of all the particles, and which exists in a plastic solid or semisolid state in an uncured state at normal temperature, wherein the average particle diameter of the phosphor is not more than 60% of the thickness of the layer formed from the heat-curable resin composition, and the maximum particle diameter thereof is not more than 90% thereof.

12 Claims, 1 Drawing Sheet

(51) Int. Cl.
  *C09K 11/77* (2006.01)
  *H01L 33/50* (2010.01)
  *H05B 33/14* (2006.01)
  *H05B 33/20* (2006.01)
  *C09D 183/04* (2006.01)
  *C09K 11/02* (2006.01)
  *C08G 77/12* (2006.01)
  *C08G 77/14* (2006.01)
  *C08G 77/20* (2006.01)

(52) U.S. Cl.
  CPC ............ *C09K 11/7721* (2013.01); *H01L 33/50* (2013.01); *H01L 33/501* (2013.01); *H05B 33/14* (2013.01); *H05B 33/20* (2013.01); *C08G 77/12* (2013.01); *C08G 77/14* (2013.01); *C08G 77/20* (2013.01); *H01L 33/505* (2013.01); *H01L 2924/0002* (2013.01); *Y10T 428/24372* (2015.01)

(56) References Cited

U.S. PATENT DOCUMENTS

| | | | |
|---|---|---|---|
| 2004/0188697 A1* | 9/2004 | Brunner et al. | 257/99 |
| 2007/0132359 A1 | 6/2007 | Wang et al. | |
| 2007/0293623 A1 | 12/2007 | Kashiwagi et al. | |
| 2008/0231170 A1* | 9/2008 | Masato et al. | 313/501 |
| 2008/0308828 A1 | 12/2008 | Kashiwagi et al. | |
| 2009/0189507 A1* | 7/2009 | Winkler et al. | 313/484 |
| 2009/0272996 A1* | 11/2009 | Chakraborty | 257/98 |
| 2010/0133989 A1 | 6/2010 | Stiles et al. | |
| 2010/0155739 A1 | 6/2010 | Kuramoto et al. | |
| 2010/0225010 A1 | 9/2010 | Katayama | |
| 2011/0054072 A1 | 3/2011 | Sawada et al. | |
| 2011/0140289 A1 | 6/2011 | Shiobara et al. | |

FOREIGN PATENT DOCUMENTS

| | | |
|---|---|---|
| EP | 1 980 591 A1 | 10/2008 |
| EP | 2 226 361 A1 | 9/2010 |
| EP | 2 289 998 A1 | 3/2011 |
| EP | 2 336 230 A1 | 6/2011 |
| JP | 7-45655 B2 | 5/1995 |
| JP | 2005-524737 | 8/2005 |
| JP | 2009/235368 | 10/2009 |
| JP | 2010-202801 | 9/2010 |
| JP | 2011-102004 A | 5/2011 |
| WO | WO 03/093393 A1 | 11/2003 |

OTHER PUBLICATIONS

Extended European Search Report Issued Feb. 20, 2013 in Patent Application No. 12190487.4.

Office Action dated Apr. 30, 2015 issued in corresponding Malaysian patent application No. PI2012700855.

* cited by examiner

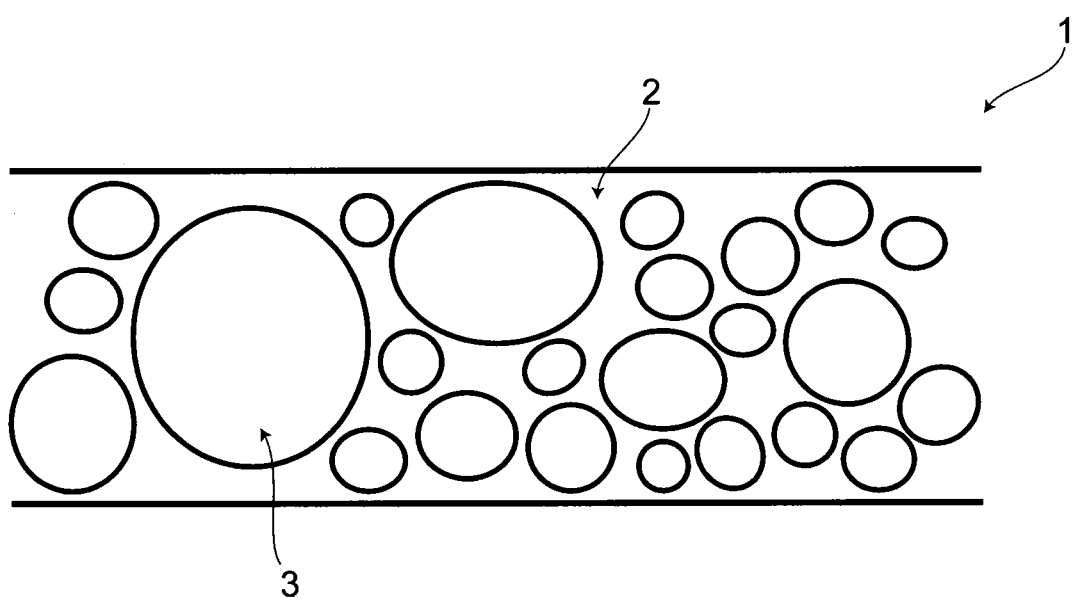

WAVELENGTH CONVERSION SHEET FILLED WITH LARGE AMOUNT OF PHOSPHOR, METHOD OF PRODUCING LIGHT EMITTING SEMICONDUCTOR DEVICE USING THE SHEET, AND LIGHT EMITTING SEMICONDUCTOR DEVICE

CROSS REFERENCE TO RELATED APPLICATIONS

The present application claims the benefit of the filing date of Japanese application no. 2011-243267, filed on Nov. 7, 2011.

BACKGROUND OF THE INVENTION

1. Field of the Invention

The present invention relates to a phosphor-containing wavelength conversion sheet, and relates particularly to a wavelength conversion sheet which can convert the wavelength of a blue light or ultraviolet light from an LED by placing the sheet on the chip surface of the LED element and then curing the sheet to cover the element, a method of producing a light emitting device that uses the sheet, and a light emitting device.

2. Description of the Prior Art

In the field of light emitting diodes (LED), the use of phosphors for the purpose of wavelength conversion is already known (Patent Document 1). Because silicone resins exhibit excellent light resistance properties, they are attracting much attention as coating materials for encapsulating and protecting LED elements (Patent Document 2). Further, silicone resin sheets containing low concentrations of phosphors have also been disclosed (Patent Document 3).

Generally, in a white LED, a phosphor is dispersed in the vicinity of the LED chip by using a method in which the chip is coated with a silicone resin or epoxy resin containing a dispersed phosphor, thereby converting the blue light to a pseudo white light. However, if the dispersion of the phosphor within the resin layer lacks uniformity or is biased, then a color shift is likely to occur, and therefore in order to produce a uniform white light, it is necessary to ensure that the phosphor is dispersed uniformly within the coating resin layer. As a result, screen printing methods and methods of uniformly dispersing the phosphor near the lower region of the coating resin layer by precipitating the phosphor have been investigated, but these methods have suffered from problems, including a complex production process and an unsatisfactory level of stability. Accordingly, a technique of easily dispersing a phosphor uniformly in the vicinity of a chip surface has been keenly sought. Wavelength conversion sheets have been implemented as a measure for addressing this issue, but conventional wavelength conversion sheets contain only small amounts of phosphor, and therefore the conversion efficiency has been inadequate.

Further, in LEDs and the like, the resin layer covering the LED element also requires high levels of heat resistance and ultraviolet resistance and the like. It would be very convenient if such resin layers could be formed using conventional production apparatus.

Patent Document 1: JP 2005-524737 A
Patent Document 2: JP 2010-202801 A
Patent Document 3: JP 2009-235368 A

SUMMARY OF THE INVENTION

Accordingly an object of the present invention is to provide a wavelength conversion sheet filled with a large amount of phosphor, which enables the phosphor to be easily dispersed uniformly and in a large amount near the surface of an LED element.

Further, another object of the present invention is to provide, using the above sheet, a method of producing a light emitting device that generates a stable and uniform white light or daylight, and a light emitting device.

In order to achieve the above object, a first aspect of the present invention provides:

a wavelength conversion sheet filled with a large amount of a phosphor, the sheet comprising:

a layer formed from a heat-curable resin composition, which contains 100 parts by mass of a resin component and 100 to 2,000 parts by mass of a particulate phosphor in which the proportion of particles having a sphericity of 0.7 to 1.0 is not less than 60% of all the particles, and which exists in a plastic solid or semisolid state in an uncured state at normal temperature, wherein the average particle diameter of the phosphor is not more than 60% of the thickness of the layer formed from the heat-curable resin composition, and the maximum particle diameter of the phosphor is not more than 90% of the thickness of the layer formed from the heat-curable resin composition.

A second aspect of the present invention provides:

a method of producing a light emitting optical semiconductor device having a covered LED element, the method comprising disposing the above wavelength conversion sheet on the surface of the LED element, and curing the sheet by heating, thereby covering the LED element with a phosphor-containing cured resin layer.

A third aspect of the present invention provides:

a light emitting optical semiconductor device having a covered LED element which is obtained using the production method described above.

Because the heat-curable resin sheet of the present invention exists as a solid or semisolid in an uncured state, handling and operability are good, and therefore the sheet can be easily laminated and bonded to the LED chip surface. Further, because the sheet is a solid or semisolid in its uncured state, the filled phosphor does not separate or precipitate during storage, meaning a resin layer in which the phosphor is dispersed uniformly can be formed in a stable manner. The phosphor-containing heat-curable resin sheet is adhered to the LED element, and following curing, a transparent resin is cast on top to encapsulate the structure. The heat-curable resin sheet can be easily laminated and bonded to the LED chip surface using a conventional mounting device such as a die bond mounter. By subsequently curing the laminated composition sheet, a cured resin layer with the phosphor dispersed uniformly therein can be formed efficiently and stably with a uniform layer thickness. Furthermore, because the phosphor is dispersed uniformly within the obtained phosphor resin layer, color shift is unlikely, and the color rendering properties are good.

BRIEF DESCRIPTION OF THE DRAWING

The FIGURE shows an embodiment of a wavelength conversion sheet according to the invention.

EMBODIMENTS OF THE INVENTION

The wavelength conversion sheet of the present invention is described below in further detail. In the following description, Me represents a methyl group, Et represents an ethyl group, Ph represents a phenyl group, and Vi represents a vinyl group.

1. Wavelength Conversion Sheet Filled with a Large Amount of Phosphor

In the FIGURE, 1 represents a wavelength conversion sheet, 2 represents a heat-curable resin composition, and 3 represents a phosphor. The wavelength conversion sheet 1 comprises a heat-curable resin composition 2 and a phosphor 3 uniformly dispersed in the heat-curable resin composition 2. The phosphors 3 are a variety of size and shape. However, the size is limited such that an average particle diameter and a maximum diameter of the phosphor 3 are not more than 60% and 90% of the thickness of the wavelength conversion sheet 1 formed from the heat-curable resin composition 2. The shape is also limited such that particles of the phosphor 3 have a sphericity of 0.7 to 1.0 and a portion of the particles of the phosphor 3 is not less than 60% of all particles.

The wavelength conversion sheet of the present invention comprises a layer formed from a heat-curable resin composition, which contains 100 parts by mass of a resin component and 100 to 2,000 parts by mass of a particulate phosphor, and exists in a plastic solid or semisolid state in an uncured state at normal temperature. Here, the expression "normal temperature" means the ambient temperature under typical conditions, and usually refers to a temperature within a range from 15 to 30° C., and typically 25° C. The term "semisolid" describes the state of a material which has plasticity, and which when molded into a specific shape, is able to retain that shape for at least one hour, and preferably 8 hours or longer. For example, although a fluid material that has an extremely high viscosity at normal temperature does essentially exhibit fluidity, in those cases when the extremely high viscosity means that no visual change (such as collapse) in an imparted shape can be ascertained during a short period of at least one hour, the material is deemed to exist in a semisolid state.

The aforementioned heat-curable resin composition exists in the above type of plastic solid or semisolid state at normal temperature, but when heated, starts to cure at a temperature of approximately 50° C. or higher. However, a phenomenon occurs wherein the composition initially softens upon heating, meaning a solid state composition changes to a state that exhibits slight fluidity, and a semisolid state composition changes to a state that exhibits slightly increased fluidity. Thereafter, the viscosity increases once again, and the composition solidifies (cures).

<Heat-Curable Resin Composition>

The layer that constitutes the wavelength conversion sheet of the present invention is formed from a heat-curable resin composition. This composition comprises a resin component and a phosphor.

a. Resin Component

Examples of the heat-curable resin composition used in the present invention include heat-curable epoxy resin compositions, heat-curable silicone resin compositions, and heat-curable hybrid resin compositions containing a silicone resin and an epoxy resin as resin components. The nature of the resin component varies for each of these types of composition. The composition includes 100 to 2,000 parts by mass of a particulate phosphor per 100 parts by mass of the resin component.

—Heat-Curable Epoxy Resin Composition:

A heat-curable epoxy resin composition typically comprises an epoxy resin, a curing agent and a curing accelerator. In the case of this type of composition, the epoxy resin and the curing agent constitute the resin component.

—Epoxy Resin:

Examples of the epoxy resin include bisphenol epoxy resins, cresol novolac epoxy resins, alicyclic epoxy resins, aliphatic epoxy resins, biphenyl epoxy resins, aralkyl epoxy resins, and epoxy resins having an isocyanuric acid backbone.

—Curing Agent:

Examples of curing agents that can be used include acid anhydrides, various phenolic resins, and various amine compounds.

—Curing Accelerator:

Examples of the curing accelerator include quaternary phosphonium salts, organic phosphines, tertiary amine compounds, and imidazoles.

Of the various possibilities, a heat-curable epoxy resin composition comprising a triazine-derived epoxy resin, an acid anhydride and a curing accelerator exhibits excellent heat resistance and light resistance, and is therefore particularly desirable as the epoxy resin composition.

Further, a composition comprising an alicyclic epoxy resin or an epoxy resin having an isocyanuric acid backbone which exhibits excellent light and heat resistance, and an acid anhydride, which is reacted at a temperature of approximately 50 to 100° C. to effect B-staging and is subsequently filled with a large amount of phosphor, is also desirable.

—Heat-Curable Silicone Resin Composition:

Examples of compositions that can be used as the heat-curable silicone resin composition include, in particular, addition-curable silicone resin compositions comprising an alkenyl group-containing organopolysiloxane, an organohydrogenpolysiloxane and a hydrosilylation catalyst, and condensation-curable silicone resin compositions comprising an alkoxysilyl group- and/or hydroxysilyl group-containing organopolysiloxane and a condensation catalyst. In the case of an addition-curable silicone resin composition, the alkenyl group-containing organopolysiloxane and the organohydrogenpolysiloxane constitute the resin component.

An example of a representative and preferred addition-curable silicone resin composition is the composition described below.

A composition comprising:

(A) an organopolysiloxane having a resin structure composed essentially of $R^1SiO_{1.5}$ units, $R^2{}_2SiO$ units and $R^3{}_aR^4{}_bSiO_{(4-a-b)/2}$ units (wherein each of $R^1$, $R^2$ and $R^3$ independently represents a methyl group, ethyl group, propyl group, cyclohexyl group or phenyl group, $R^4$ represents a vinyl group or allyl group, a represents 0, 1 or 2, and b represents 1 or 2, provided that a+b is 2 or 3), and including a structure in which at least a portion of the $R^2{}_2SiO$ units are connected in a continuous repeating sequence, wherein the number of units in the repeating sequence is from 5 to 300, (B) an organohydrogenpolysiloxane having a resin structure composed essentially of $R^1SiO_{1.5}$ units, $R^2{}_2SiO$ units and $R^3{}_cH_dSiO_{(4-c-d)/2}$ units (wherein each of $R^1$, $R^2$ and $R^3$ is independently as defined above, c represents 0, 1 or 2, and d represents 1 or 2, provided that c+d is 2 or 3), and including a structure in which at least a portion of the $R^2{}_2SiO$ units are connected in a continuous repeating sequence, wherein the number of units in the repeating sequence is from 5 to 300: the organohydrogenpolysiloxane provided in an amount such that the molar ratio of hydrogen atoms bonded to silicon atoms within the component (B) relative to the vinyl groups and/or allyl groups within the component (A) is within a range from 0.1 to 4.0, and (C) an Effective Curing Amount of a Platinum Group Metal-Based Catalyst.

A cured product layer obtained by curing an aforementioned heat-curable silicone composition is a hard resin, and yet still exhibits excellent flexibility and minimal surface tack, and also offers the advantage of being able to be readily molded with conventional molding apparatus.

In the phosphor used to fill the silicone resin or epoxy resin, at least 60% of all the phosphor particles have a particle shape with a sphericity of 0.7 to 1.0, and the maximum particle diameter for the phosphor is not more than 90% of the film thickness. The heat-curable resin sheet filled with a large amount of phosphor comprises one or more types of phosphor, wherein the total amount of the phosphor is from 100 to 2,000 parts by mass per 100 parts by mass of the curable resin, and exists in a plastic solid or semisolid state in an uncured state at normal temperature.

The present invention provides a method of producing a light emitting device, the method comprising disposing a heat-curable resin sheet formed from the above phosphor-containing heat-curable resin layer on the surface of an LED element, and heat curing the resin sheet to cover the surface of the LED element.

Moreover, the present invention also provides a light emitting device having an LED element which is covered with at least a phosphor-containing resin layer obtained using the method described above.

The components of the above heat-curable silicone resin composition are described below in order.

—(A) Organopolysiloxane Having a Resin Structure—

The organopolysiloxane having a resin structure (namely, a three dimensional network structure) that functions as the important component (A) of the composition of the present invention is composed of $R^1SiO_{1.5}$ units, $R^2{}_2SiO$ units and $R^3{}_aR^4{}_bSiO_{(4-a-b)/2}$ units (wherein each of $R^1$, $R^2$ and $R^3$ represents a methyl group, ethyl group, propyl group, cyclohexyl group or phenyl group, $R^4$ represents a vinyl group or allyl group, a represents 0, 1 or 2, and b represents 1 or 2, provided that a+b is 2 or 3), and includes a partial structure in which at least a portion of the $R^2{}_2SiO$ units are connected in a continuous repeating sequence, wherein the number of units in the repeating sequence is from 5 to 300, preferably from 10 to 300, more preferably from 15 to 200, and still more preferably from 20 to 100.

The structure in which at least a portion of the $R^2{}_2SiO$ units are connected in a continuous repeating sequence, and in which the number of units in the repeating sequence is from 5 to 300, refers to a linear diorganopolysiloxane chain structure represented by general formula (1) shown below:

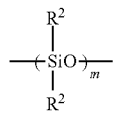

wherein m represents an integer of 5 to 300.

At least a portion of all the $R^2{}_2SiO$ units that exist within the organopolysiloxane of the component (A), and preferably at least 50 mol % (50 to 100 mol %) and particularly 80 mol % or more (80 to 100 mol %) of the $R^2{}_2SiO$ units, form a chain structure represented by general formula (1) within the molecule.

In a molecule of the component (A), the presence of the $R^2{}_2SiO$ units causes the polymer molecule to extend in a linear structure, whereas the $R^1SiO_{1.5}$ units cause branching of the polymer molecule or the formation of a three dimensional network structure. The $R^4$ groups (vinyl groups or allyl groups) within the $R^3{}_aR^4{}_bSiO_{(4-a-b)/2}$ units perform the role of curing the composition of the present invention by undergoing a hydrosilylation addition reaction with the hydrogen atoms bonded to silicon atoms (namely, SiH groups) of the $R^3{}_cH_dSiO_{(4-c-d)/2}$ units within the component (B) described below.

The molar ratio between the three essential siloxane units that constitute the component (A), namely the molar ratio of $R^1SiO_{1.5}$ units:$R^2{}_2SiO$ units:$R^3{}_aR^4{}_bSiO_{(4-a-b)/2}$ units is preferably within a range from 90 to 24:75 to 9:50 to 1, and is particularly preferably within a range from 70 to 28:70 to 20:10 to 2 (provided the total is 100), as such a ratio yields more favorable properties for the resulting cured product.

The polystyrene-equivalent weight-average molecular weight of the component (A) determined by gel permeation chromatography (GPC) is typically within a range from 3,000 to 1,000,000, and particularly from 10,000 to 100,000, as this ensures that the polymer exists in a plastic solid or semisolid state, and provides favorable levels of workability and curability and the like.

This type of organopolysiloxane having a resin structure can be synthesized, for example, by combining the compounds that act as the raw materials for each of the units, in amounts that enable the three siloxane units to be formed within the product polymer in the required molar ratio, and then conducting a cohydrolysis-condensation in the presence of an acid.

Examples of the raw material for the $R^1SiO_{1.5}$ units include chlorosilanes such as $MeSiCl_3$, $EtSiCl_3$, $PhSiCl_3$, propyltrichlorosilane and cyclohexyltrichlorosilane, and the alkoxysilanes such as methoxysilanes that correspond with each of these chlorosilanes.

Examples of the raw material for the $R^2{}_2SiO$ units include the compounds shown below:

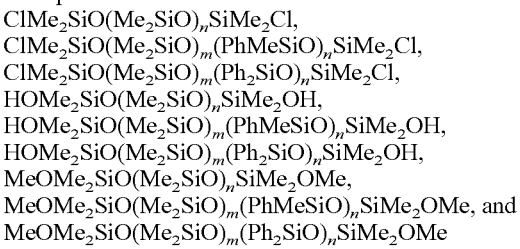

wherein m represents an integer of 5 to 150 (average value), and n represents an integer of 5 to 300 (average value).

Furthermore, the $R^3{}_aR^4{}_bSiO_{(4-a-b)/2}$ units represent any one siloxane unit or combination of two or more siloxane units selected from among $R^3R^4SiO$ units, $R^3{}_2R^4SiO_{0.5}$ units, $R^4{}_2SiO$ units and $R^3R^4{}_2SiP_{0.5}$ units. The raw materials for these units include chlorosilanes such as $Me_2ViSiCl$, $MeViSiCl_2$, $Ph_2ViSiCl$ and $PhViSiCl_2$, and alkoxysilanes such as methoxysilanes that correspond with each of these chlorosilanes.

In the present invention, the expression that the organopolysiloxane of the component (A) is "composed essentially of $R^1SiO_{1.5}$ units, $R^2{}_2SiO$ units and $R^3{}_aR^4{}_bSiO_{(4-a-b)/2}$ units" means that not less than 90 mol % (90 to 100 mol %), and preferably not less than 95 mol % (95 to 100 mol %) of the siloxane units that constitute the component (A) are composed of these three types of siloxane units, and from 0 to 10 mol %, and preferably 0 to 5 mol %, of the siloxane units may be other siloxane units. Specifically, during production of the organopolysiloxane of the component (A) by cohydrolysis and condensation of the raw materials described above, besides the $R^1SiO_{1.5}$ units, $R^2{}_2SiO$ units and/or $R^3{}_aR^4{}_bSiO_{(4-a-b)/2}$ units, siloxane units having a silanol group may be formed via a secondary reaction. The organopolysiloxane of the component (A) typically comprises not more than 10 mol % (0 to 10 mol %), and preferably not more than 5 mol % (0 to 5 mol %) of these silanol group-containing siloxane units relative to the combined total of all the siloxane units. Examples of the silanol group-containing siloxane units include $R^1(HO)SiO$ units, $R^1(HO)_2SiO_{0.5}$ units, $R^2{}_2(HO)$ $SiO_{0.5}$ units, $R^3{}_aR^4{}_b(HO)SiO_{(3-a-b)/2}$ units and $R^3{}_aR^4{}_b(HO)_2SiO_{(2-a-b)/2}$ units (wherein $R^1$ to $R^4$, a and b are each the same as defined above).

—(B) Organohydrogenpolysiloxane Having a Resin Structure—

The organohydrogenpolysiloxane having a resin structure (namely, a three dimensional network structure) that functions as the important component (B) of the composition of the present invention is composed essentially of $R^1SiO_{1.5}$ units, $R^2{}_2SiO$ units and $R^3{}_cH_dSiO_{(4-c-d)/2}$ units (wherein $R^1$, $R^2$ and $R^3$ are the same as defined above, c represents 0, 1 or 2, and d represents 1 or 2, provided that c+d is 2 or 3), and includes a partial linear siloxane structure in which at least a portion of the $R^2{}_2SiO$ units are connected in a continuous repeating sequence, wherein the number of units in the repeating sequence is within a range from 5 to 300, preferably from 10 to 300, more preferably from 15 to 200, and still more preferably from 20 to 100. In a similar manner to that described for the component (A), the structure in which at least a portion of the $R^2{}_2SiO$ units are connected in a continuous repeating sequence, and in which the number of units in the repeating sequence is within a range from 5 to 300, describes a structure in which at least a portion of the $R^2{}_2SiO$ units, and preferably not less than 50 mol % (50 to 100 mol %) and particularly not less than 80 mol % (80 to 100 mol %) of the $R^2{}_2SiO$ units, that exist within the component (B) form a linear diorganopolysiloxane continuous chain structure represented by the above general formula (1) within the molecule of the component (B).

In a molecule of the component (B), the presence of the $R^2{}_2SiO$ units causes the polymer molecule to extend in a linear structure, whereas the $R^1SiO_{1.5}$ units cause branching of the polymer molecule, or the formation of a three dimensional network structure. The hydrogen atoms bonded to silicon atoms within the $R^3{}_cH_dSiO_{(4-c-d)/2}$ units perform the role of curing the composition of the present invention by undergoing a hydrosilylation addition reaction with the alkenyl groups within the component (A).

The molar ratio between the three essential siloxane units that constitute the component (B), namely the molar ratio of $R^1SiO_{1.5}$ units:$R^2{}_2SiO$ units:$R^3{}_cH_dSiO_{(4-c-d)/2}$ units is preferably within a range from 90 to 24:75 to 9:50 to 1, and is particularly preferably within a range from 70 to 28:70 to 20:10 to 2 (provided the total is 100), as such a ratio yields more favorable properties for the resulting cured product.

The polystyrene-equivalent weight-average molecular weight of the component (B) determined by GPC is typically within a range from 3,000 to 1,000,000, and particularly from 10,000 to 100,000, as this yields more favorable workability and better properties for the cured product.

An organohydrogenpolysiloxane having this type of resin structure can be synthesized, for example, by combining the compounds that act as the raw materials for each of the units, in amounts that enable the three siloxane units to be formed within the product polymer in the required molar ratio described above, and then conducting a cohydrolysis-condensation.

Examples of the raw materials for the $R^1SiO_{1.5}$ units include $MeSiCl_3$, $EtSiCl_3$, $PhSiCl_3$, propyltrichlorosilane and cyclohexyltrichlorosilane, and the alkoxysilanes such as methoxysilanes that correspond with each of these chlorosilanes.

Examples of the raw material for the $R^2{}_2SiO$ units include the compounds shown below.

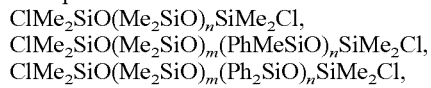
$ClMe_2SiO(Me_2SiO)_m(PhMeSiO)_nSiMe_2Cl$,
$ClMe_2SiO(Me_2SiO)_m(Ph_2SiO)_nSiMe_2Cl$,
$HOMe_2SiO(Me_2SiO)_nSiMe_2OH$,
$HOMe_2SiO(Me_2SiO)_m(PhMeSiO)_nSiMe_2OH$,
$HOMe_2SiO(Me_2SiO)_m(Ph_2SiO)_nSiMe_2OH$,
$MeOMe_2SiO(Me_2SiO)_nSiMe_2OMe$,
$MeOMe_2SiO(Me_2SiO)_m(PhMeSiO)_nSiMe_2OMe$, and
$MeOMe_2SiO(Me_2SiO)_m(Ph_2SiO)_nSiMe_2OMe$ wherein m represents an integer of 5 to 150 (average value), and n represents an integer of 5 to 300 (average value).

Furthermore, the $R^3{}_cH_dSiO_{(4-c-d)/2}$ units represent any one siloxane unit or combination of two or more siloxane units selected from amongst $R^3HSiO$ units, $R^3{}_2HSiO_{0.5}$ units, $H_2SiO$ units and $R^3H_2SiO_{0.5}$ units. The raw materials for these units include chlorosilanes such as $Me_2HSiCl$, $MeHSiCl_2$, $Ph_2HSiCl$ and $PhHSiCl_2$, and alkoxysilanes such as methoxysilanes that correspond with each of these chlorosilanes.

In the present invention, the expression that the organohydrogenpolysiloxane of the component (B) is "composed essentially of $R^1SiO_{1.5}$ units, $R^2{}_2SiO$ units and $R^3{}_cH_dSiO_{(4-c-d)/2}$ units" means that not less than 90 mol % (90 to 100 mol %), and preferably not less than 95 mol % (95 to 100 mol %) of the siloxane units that constitute the component (B) are composed of these three types of siloxane units, and from 0 to 10 mol %, and preferably 0 to 5 mol %, of the siloxane units may be other siloxane units. Specifically, during production of the organohydrogenpolysiloxane of the component (B) by cohydrolysis and condensation of the raw materials described above, besides the $R^1SiO_{1.5}$ units, $R^2{}_2SiO$ units and $R^3{}_cH_dSiO_{(4-c-d)/2}$ units, siloxane units having a silanol group may be formed via a secondary reaction. The organohydrogenpolysiloxane of the component (B) typically comprises not more than 10 mol % (0 to 10 mol %), and preferably not more than 5 mol % (0 to 5 mol %) of these silanol group-containing siloxane units relative to the combined total of all the siloxane units. Examples of the silanol group-containing siloxane units include $R^1(HO)SiO$ units, $R^1(HO)_2SiO_{0.5}$ units, $R^2{}_2(HO)SiO_{0.5}$ units, $R^3{}_cH_d(HO)SiO_{(3-c-d)/2}$ units and $R^3{}_cH_d(HO)_2SiO_{(2-c-d)/2}$ units (wherein $R^1$ to $R^3$, c and d are each the same as defined above).

The amount added of the organohydrogenpolysiloxane of the component (B) is such that the molar ratio of hydrogen atoms bonded to silicon atoms (SiH groups) within the component (B) relative to the combined total of vinyl groups and allyl groups within the component (A) is typically within a range from 0.1 to 4.0, preferably from 0.5 to 3.0, and more preferably from 0.8 to 2.0. If this ratio is less than 0.1, then the curing reaction proceeds poorly, and achieving a silicone cured product becomes difficult, whereas if the ratio exceeds 4.0, then a large number of unreacted SiH groups remain within the cured product, which can cause changes in the properties of the cured product over time, and is therefore undesirable.

—(C) Platinum Group Metal-Based Catalyst—

This catalyst component is added to accelerate the addition curing reaction of the composition of the present invention, and is typically a platinum-based, palladium-based, or rhodium-based catalyst. From the viewpoints of cost and the like, platinum-based catalysts such as platinum, platinum black, chloroplatinic acid, and other platinum compounds such as $H_2PtCl_6 \cdot mH_2O$, $K_2PtCl_6$, $KHPtCl_6 \cdot mH_2O$, $K_2PtCl_4$, $K_2PtCl_4 \cdot mH_2O$ and $PtO_2 \cdot mH_2O$ (wherein m represents a positive integer), as well as complexes of these compounds with hydrocarbons such as olefins, alcohols, or vinyl group-containing organopolysiloxanes are preferred. These catalysts may be used either individually, or in combinations of two or more different catalysts.

The amount added of the component (C) need only be sufficient to ensure effective curing, and the catalyst is typically used in an amount, calculated as the mass of the platinum group metal relative to the combined mass of the components (A) and (B), that is within a range from 0.1 to 500 ppm, and preferably from 0.5 to 100 ppm.

—Other Components—

Besides the components described above, the heat-curable resin composition used in the present invention may also include various conventional additives as required.

—Adhesion Assistant:

In order to impart adhesiveness to the composition of the present invention, an adhesion assistant may be added as required. Examples of silicone-based adhesion assistants include linear or cyclic organosiloxane oligomers of 4 to 50 silicon atoms, and preferably 4 to 20 silicon atoms, comprising at least two, and preferably either two or three, functional groups selected from among a hydrogen atom bonded to a silicon atom (SiH group), an alkenyl group bonded to a silicon atom (such as a Si—CH=CH$_2$ group), an alkoxysilyl group (such as a trimethoxysilyl group) and an epoxy group (such as a glycidoxypropyl group or 3,4-epoxycyclohexylethyl group) within each molecule, and organooxysilyl-modified isocyanurate compounds represented by general formula (2) shown below and/or hydrolysis-condensation products thereof (organosiloxane-modified isocyanurate compounds).

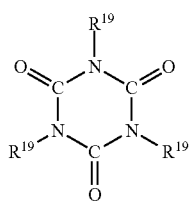

(2)

In the above formula, $R^{19}$ represents an organic group represented by formula (3) shown below:

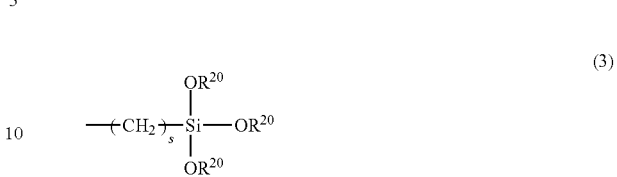

(3)

(wherein $R^{20}$ represents a hydrogen atom or a monovalent hydrocarbon group of 1 to 6 carbon atoms, and s represents an integer of 1 to 6, and preferably 1 to 4), or a monovalent hydrocarbon group comprising an aliphatic unsaturated bond, provided that at least one of the $R^{19}$ groups is an organic group represented by formula (3).

Examples of the monovalent hydrocarbon group comprising an aliphatic unsaturated bond represented by $R^{19}$ in general formula (2) include alkenyl groups of 2 to 8 carbon atoms, and particularly 2 to 6 carbon atoms, such as a vinyl group, allyl group, propenyl group, isopropenyl group, butenyl group, isobutenyl group, pentenyl group and hexenyl group, and cycloalkenyl groups of 6 to 8 carbon atoms such as a cyclohexenyl group. Further, examples of the monovalent hydrocarbon group represented by $R^{20}$ in formula (3) include monovalent hydrocarbon groups of 1 to 8 carbon atoms, and particularly 1 to 6 carbon atoms, including alkyl groups such as a methyl group, ethyl group, propyl group, isopropyl group, butyl group, isobutyl group, tert-butyl group, pentyl group, hexyl group and cyclohexyl group, the alkenyl groups and cycloalkenyl groups exemplified above for $R^{19}$, and aryl groups such as a phenyl group, and among these, an alkyl group is preferred.

Furthermore, other examples of the adhesion assistant include 1,5-glycidoxypropyl-1,3,5,7-tetramethylcyclotetrasiloxane, 1-glycidoxypropyl-5-trimethoxysilylethyl-1,3,5,7-tetramethylcyclotetrasiloxane, and the compounds represented by the formulas shown below.

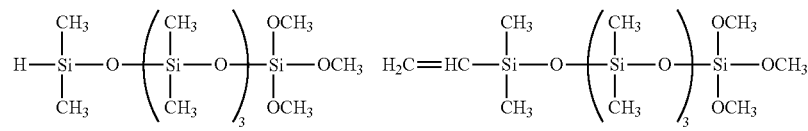

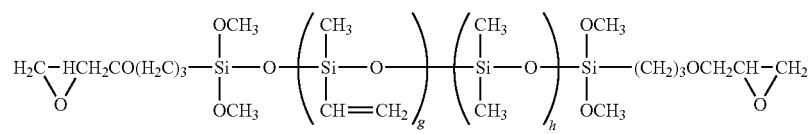

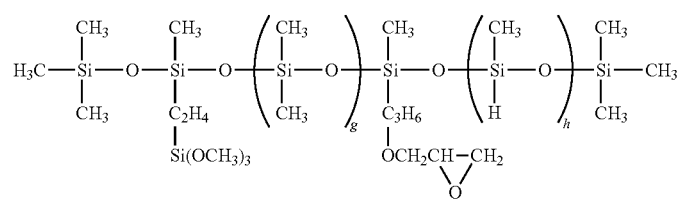

In the above formulas, each of g and h represents a positive integer within a range from 0 to 50, provided that g+h is from 2 to 50, and preferably from 4 to 20.

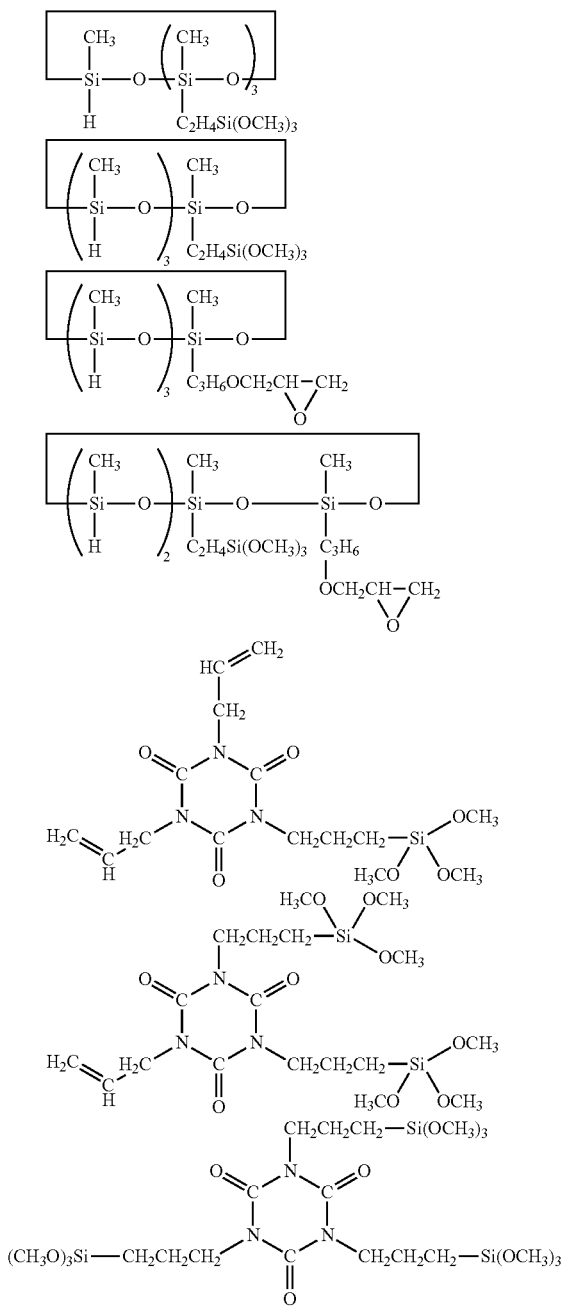

Of the organosilicon compounds described above, examples of compounds that impart the resulting cured product with particularly superior adhesion include organosilicon compounds having a silicon atom-bonded alkoxy group and an alkenyl group or silicon atom-bonded hydrogen atom (SiH group) within each molecule.

Among the adhesion assistants described above, the use of epoxy functional alkoxysilanes such as γ-glycidoxypropyltrimethoxysilane, γ-glycidoxypropylmethyldiethoxysilane and β-(3,4-epoxycyclohexyl)ethyltrimethoxysilane, amino functional alkoxysilanes such as N-β-(aminoethyl)-γ-aminopropyltrimethoxysilane, γ-aminopropyltriethoxysilane and N-phenyl-γ-aminopropyltrimethoxysilane, and mercapto functional alkoxysilanes such as γ-mercaptopropyltrimethoxysilane is preferred.

The amount added of the adhesion assistant is typically not more than 10 parts by mass (namely, 0 to 10 parts by mass), and is preferably 0.1 to 8 parts by mass, and more preferably approximately 0.2 to 5 parts by mass, per 100 parts by mass of the combination of the components (A), (B) and (C). An amount that is too large can have adverse effects on the hardness of the cured product, and may increase the surface tack.

—Curing Retarder:

In those cases where the heat-curable silicone resin composition used in the present invention is an addition-curable silicone resin composition, an appropriate amount of a curing retarder may be added as required. Examples of the curing retarder include compounds selected from the group consisting of organopolysiloxanes with a high vinyl group content such as tetramethyltetravinylcyclotetrasiloxane, triallyl isocyanurate, alkyl maleates, acetylene alcohols and silane-modified and siloxane-modified products thereof, hydroperoxides, tetramethylethylenediamine, benzotriazole, and mixtures of the above compounds. The component (E) may employ either a single material or a combination of two or more different materials. The amount added of the curing retarder is typically from 0.001 to 1.0 parts by mass, and preferably from 0.005 to 0.5 parts by mass, per 100 parts by mass of the resin component.

—Heat-Curable Epoxy-Silicone Hybrid Resin Composition

A heat-curable epoxy-silicone hybrid resin composition is a composition that comprises, as the resin component, a hybrid resin in which an epoxy resin and a silicone resin are bonded together chemically (for example, see JP 2011-74359 A). Upon curing, these resin compositions form an interpenetrating polymer network (IPN). This IPN is derived from the two resin materials that have been mutually interconnected by chemical bonding, and provides superior properties (such as abrasion resistance and toughness) compared with a simple mixture of the two materials prepared without forming an IPN structure.

A preferred epoxy-silicone hybrid resin can be prepared by reacting an epoxy resin having an alicyclic epoxy backbone or isocyanuric acid backbone that exhibits particularly superior light and heat resistance at a temperature of approximately 50 to 100° C. using a curing agent such as an acid anhydride to effect B-staging, and then mixing a phosphor and converting the composition to a sheet-like form.

b. Phosphor

The phosphor may be any conventional phosphor. For example, any phosphor may be used that absorbs the light emitted from a semiconductor light emitting diode that employs a nitride-based semiconductor as the light emitting layer, and performs a wavelength conversion that alters the wavelength of the light to a different wavelength. For example, one or more phosphors selected from among nitride-based phosphors or oxynitride-based phosphors activated mainly with lanthanoid elements such as Eu and Ce, alkaline earth halogen apatite phosphors, alkaline earth metal halogen borate phosphors, alkaline earth metal aluminate phosphors, alkaline earth silicate phosphors, alkaline earth sulfide phosphors, alkaline earth thiogallate phosphors, alkaline earth silicon nitride phosphors and germanate phosphors activated mainly with lanthanoid elements such as Eu or transition metal elements such as Mn, rare earth aluminate phosphors and rare earth silicate phosphors activated mainly with lanthanoid elements such as Ce, organic and organic complex phosphors activated mainly with lanthanoid elements such as Eu, and Ca—Al—Si—O—N based oxynitride glass phosphors are preferred. Specifically, the phosphors listed below can be used, although the following is not an exhaustive list.

Examples of nitride-based phosphors activated mainly with lanthanoid elements such as Eu and Ce include $M_2Si_5N_8$:Eu (wherein M is at least one element selected from among Sr, Ca, Ba, Mg and Zn). Furthermore, besides $M_2Si_5N_8$:Eu, other examples include $MSi_7N_{10}$:Eu, $M_{1.8}Si_5O_{0.2}N_8$:Eu, and $M_{0.9}Si_7O_{0.1}N_{10}$:Eu (wherein M is at least one element selected from among Sr, Ca, Ba, Mg and Zn).

Examples of oxynitride-based phosphors activated mainly with lanthanoid elements such as Eu and Ce include $MSi_2O_2N_2$:Eu (wherein M is at least one element selected from among Sr, Ca, Ba, Mg and Zn).

Examples of alkaline earth halogen apatite phosphors activated mainly with lanthanoid elements such as Eu or transition metal elements such as Mn include $M_5(PO_4)_3X$:R (wherein M represents at least one element selected from among Sr, Ca, Ba, Mg and Zn, X represents at least one element selected from among F, Cl, Br and I, and R represents at least one of Eu, Mn, and a combination of Eu and Mn).

Examples of alkaline earth metal halogen borate phosphors include $M_2B_5O_9X$:R (wherein M represents at least one element selected from among Sr, Ca, Ba, Mg and Zn, X represents at least one element selected from among F, Cl, Br and I, and R represents at least one of Eu, Mn, and a combination of Eu and Mn).

Examples of alkaline earth metal aluminate phosphors include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (wherein R represents at least one of Eu, Mn, and a combination of Eu and Mn).

Examples of alkaline earth sulfide phosphors include $La_2O_2S$:Eu, $Y_2O_2S$:Eu, and $Gd_2O_2S$:Eu.

Examples of rare earth aluminate phosphors activated mainly with lanthanoid elements such as Ce include YAG phosphors represented by composition formulas such as $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y,Gd)_3(Al,Ga)_5O_{12}$. Further, other examples include phosphors such as $Tb_3Al_5O_{12}$:Ce and $Lu_3Al_5O_{12}$:Ce in which some or all of the Y has been replaced with Tb or Lu or the like.

Examples of other phosphors include ZnS:Eu, $Zn_2GeO_4$:Mn and $MGa_2S_4$:Eu (wherein M represents at least one element selected from among Sr, Ca, Ba, Mg and Zn.)

If desired, the above phosphors may also comprise one or more elements selected from among Tb, Cu, Ag, Au, Cr, Nd, Dy, Co, Ni and Ti, either instead of Eu or in addition to Eu.

Ca—Al—Si—O—N based oxynitride glass phosphors are phosphors in which the matrix material is an oxynitride glass comprising from 20 to 50 mol % of $CaCO_3$ calculated as CaO, from 0 to 30 mol % of $Al_2O_3$, from 25 to 60 mol % of SiO, from 5 to 50% of AlN, and from 0.1 to 20 mol % of rare earth oxides or transition metal oxides, provided that the combination of these five materials totals 100 mol %. In a phosphor that employs an oxynitride glass as the matrix material, the nitrogen content is preferably not more than 15 wt %, and in addition to the rare earth oxide ions, another rare earth element ion that functions as a sensitizer is preferably included within the phosphor glass in the form of a rare earth oxide in a amount within a range from 0.1 to 10 mol % so as to function as a co-activator.

Furthermore, besides the phosphors described above, other phosphors that offer similar performance and effects can also be used.

Even when the resin composition is filled with a large amount of the phosphor, the uncured wavelength conversion sheet requires appropriate tensile strength and elasticity in the step of bonding the sheet to the surface of the LED element. As a result, phosphor particles for which the sphericity is within a range from 0.7 to 1.0 preferably represent not less than 60%, more preferably not less than 70%, and still more preferably 80% or more, of all the particles. Moreover, for the same reason, the average particle diameter of the phosphor is preferably not more than 60%, more preferably not more than 50%, and still more preferably within a range from 20 to 50%, of the sheet thickness. Here, the term "sphericity" refers to the value obtained by using SEM observation to measure the ratio of the shortest diameter of a powder particle relative to the longest diameter of the particle. Further, the "average particle diameter" refers to the cumulative weight-average value $D_{50}$ (or median value) determined using a particle size distribution measurement apparatus that employs a laser diffraction method.

The phosphor may exist in various forms, including granular forms prepared by crushing the phosphor, crystalline forms that have had the corners removed and are close to a spherical shape, produced by appropriate control of the crystal growth conditions, and spherical forms produced by granulation or thermal spraying or the like. Of these, phosphors that are effective in the present invention are those that have the type of particle sphericity of 0.7 to 1.0 described above. Even in the case of granular phosphors, a high degree of filling can be achieved by mixing the phosphor with a phosphor having a high degree of sphericity.

The particle diameter can be determined, for example, by measuring the particle size distribution by a laser diffraction method using a Cilas laser measurement apparatus. The range of usable particle diameters for the phosphor include particles from the sub-micron level to particles having a diameter that is 90% of the sheet thickness. Of these, phosphors having at least two peaks in the particle size distribution are desirable. In order to achieve a particle size distribution having at least two peaks, either two or more types of phosphor having different particle diameters may be mixed, or a phosphor that yields two or more peaks during the phosphor production may be produced directly.

Further, the maximum particle diameter of the phosphor particles is preferably not more than 90%, more preferably not more than 80%, and still more preferably within a range from 70 to 30%, of the thickness of the heat-curable resin composition layer within the wavelength conversion sheet of the present invention. If the maximum particle diameter of the phosphor particles is too large, then the distribution of the phosphor within the sheet is prone to losing uniformity, which is undesirable.

In the heat-curable resin composition used in the present invention, the amount of the phosphor is typically within a range from 100 to 2,000 parts by mass, preferably more than 100 parts by mass but not more than 2,000 parts by mass, more preferably from 200 to 1,800 parts by mass, and still more preferably from 200 to 1,600 parts by mass, per 100 parts by mass of the resin component.

c. Other Components

—Inorganic Filler:

Examples of inorganic fillers include reinforcing inorganic fillers such as fumed silica, fumed titanium dioxide and fumed alumina, and non-reinforcing inorganic fillers such as fused silica, alumina, calcium carbonate, calcium silicate, titanium dioxide, ferric oxide and zinc oxide. These inorganic fillers may be added to the composition in amounts totaling not more than 600 parts by mass (0 to 600 parts by mass) per 100 parts by mass of the combination of the components (A) and (B).

d. Properties

The heat-curable resin composition used in the present invention, and therefore the composition layer formed from this composition that constitutes the wavelength conversion sheet, exist in a plastic solid or semisolid state in an uncured state at normal temperature. Accordingly, the wavelength conversion sheet of the present invention can easily be softened by heating. As a result, the sheet can penetrate into even very narrow spaces without damaging gold wires and the like, and by performing subsequent curing, satisfactory coating and encapsulation is achieved.

e. Preparation

In order to prepare the wavelength conversion sheet filled with a large amount of phosphor according to the present invention, the heat-curable resin composition is first prepared by uniformly mixing the aforementioned resin component, phosphor and any other required components. At this time, any necessary and appropriate conventional steps may be performed depending on whether the composition is an epoxy resin composition, a silicone resin composition or a hybrid resin. For example, in the case of an addition-curable silicone resin composition, a composition may first be prepared using all of the components besides the phosphor, and this composition and the phosphor then dissolved in a solvent and mixed uniformly using a mixing device such as a ball mill. As is the case conventionally, the components may be stored as two separate liquids to prevent curing from proceeding, with the two liquids then mixed and supplied to the following step at the time of use, or alternatively, the composition may also be prepared as a single liquid by adding a small amount of an aforementioned curing retarder such as an acetylene alcohol.

In order to produce a silicone wavelength conversion sheet of the present invention, the heat-curable silicone resin composition prepared in the manner described above is, for example, applied in a sheet-like form to a release film using a film coater or a hot press or the like. The thickness of the sheet is typically 10 to 100 µm, and preferably 20 to 100 µm. If the sheet is too thin, then making a sheet of uniform thickness in which the phosphor is dispersed uniformly becomes difficult, whereas if the sheet is too thick, there is a possibility that a reduction in the phosphor concentration may cause a deterioration in the wavelength conversion efficiency. A wavelength conversion sheet produced in this manner is usually refrigerated for storage.

2. Method of Producing Light Emitting Semiconductor Device

The method of producing a light emitting semiconductor device by encapsulating an LED element using the wavelength conversion sheet of the present invention is described below using an example in which the heat-curable resin composition is a silicone resin composition, but also includes those cases in which other heat-curable resin compositions are used.

For example, following bonding of a blue LED to a ceramic substrate having external connection terminals using a resin die bonding material, the external connection terminals and the LED element are connected using gold wire. In order to encapsulate an LED device of this type, the phosphor-containing silicone resin wavelength conversion sheet of the present invention is adhered so as to cover the entire substrate and the mounted LED, and the sheet is then heated to cure the entire LED device.

The silicone resin wavelength conversion sheet of the present invention softens easily upon heating, and the viscosity initially decreases slightly, meaning even when the sheet is adhered to the gold wire, favorable coating can be achieved without damaging the gold wire, with curing then performed thereafter. The wavelength conversion resin layer, which typically encapsulates a plurality of LED elements mounted on the substrate in the manner described above, is often subsequently sealed and covered by casting or molding a transparent heat-curable silicone resin, which is subsequently cured. The resulting structure is then diced to generate individual units. In the case of LED devices in which the connection with the external terminals is achieved by gold bumps rather than gold wires, encapsulation can be performed in the same manner as that described for the gold wire-connected device.

Further, in the case of an LED element mounted inside a reflector, the phosphor-containing silicone resin wavelength conversion sheet is adhered so as to cover the LED element and the gold wires connected to the external connection terminals, and the sheet is then heated and cured. Subsequently, a transparent silicone resin is injected into the reflector and cured to complete production of the light emitting semiconductor device.

Compared with a device prepared using the conventional method of pouring in a casting silicone resin containing a phosphor, causing precipitation of the phosphor, and then curing the resin, the light emitting semiconductor device of the present invention exhibits no color shift, and is able to generate a uniform white light with good efficiency.

In the case where the substrate and the LED element are bonded using the flip-chip method, the LED element and the substrate are first bonded via a gold bump or the like, and an underfill material composed of a silicone resin or epoxy resin containing silica or the like is injected onto the structure and cured to protect the bump and the element. Subsequently, the phosphor-containing silicone resin wavelength conversion sheet is adhered to the surface of the LED element, and heating is then performed to cure the wavelength conversion sheet and form a phosphor-dispersed wavelength conversion layer. The color of the light following wavelength conversion and the encapsulation shape can be controlled by adjusting the phosphor content and the thickness of the wavelength conversion sheet.

Pressure bonding of the wavelength conversion sheet to the LED element is typically performed at a temperature within a range from normal temperature to 300° C., under a pressure of not more than 10 MPa (typically 0.01 to 10 MPa), preferably not more than 5 MPa (for example, 0.1 to 5 MPa), and particularly 0.5 to 5 MPa.

As described above, the wavelength conversion sheet of the present invention exists in a plastic solid or semisolid state in an uncured state, but that uncured state may be either an A-stage (uncured) state or a B-stage state. The wavelength conversion sheet starts to cure at a temperature of 50° C. or higher, and exhibits a phenomenon wherein the sheet softens slightly before solidifying. As a result, even in the case of LEDs that are connected with gold wires, encapsulation can be achieved without causing deformation of the wires.

In those cases where heating of the A-stage (uncured state) causes the viscosity to fall too low, the sheet may be left to stand in advance under temperature conditions of 50° C. to 100° C., so that the curing reaction proceeds until the desired viscosity is obtained. This type of procedure is merely detail that may be freely selected within the scope of the present invention.

Curing of the wavelength conversion sheet is typically conducted at 50 to 200° C., and particularly 70 to 180° C., for 1 to 30 minutes, and particularly 2 to 10 minutes. Further, post-curing may be performed at 50 to 200° C., and particularly 70 to 180° C., for 0.1 to 10 hours, and particularly 1 to 4 hours.

EXAMPLES

Specifics of the present invention are described below using a series of synthesis examples, examples and comparative examples, but the present invention is in no way limited by the examples presented below. Viscosity values in the following examples refer to values measured at 25° C. Furthermore, the weight-average molecular weight values refer to values measured by gel permeation chromatography (GPC) and referenced against polystyrene standards. Ph represents a phenyl group, Me represents a methyl group, and Vi represents a vinyl group.

Synthesis Example 1

—Vinyl Group-containing Organopolysiloxane Resin (A1)—

An organosilane represented by $PhSiCl_3$:27 mol, $ClMe_2SiO(Me_2SiO)_{33}SiMe_2Cl$:1 mol, and $MeViSiCl_2$: 3 mol were dissolved in toluene solvent, the solution was added dropwise to water to effect a cohydrolysis, the product was washed with water, neutralized by alkali washing and dewatered, and the solvent was then stripped, yielding a vinyl group-containing resin (A1). In this resin, the composition ratio between the constituent siloxane units and a structure represented by $[-SiMe_2O-(Me_2SiO)_{33}-SiMe_2O_{2/2}]$ is represented by the formula: $[PhSiO_{3/2}]_{0.27}[-SiMe_2O-(Me_2SiO)_{33}-SiMe_2O_{2/2}]_{0.01}[MeViSiO_{2/2}]_{0.03}$. The weight-average molecular weight of this resin was 62,000, and the melting point was 60° C.

Synthesis Example 2

—Hydrosilyl Group-Containing Organopolysiloxane Resin (B1)—

An organosilane represented by $PhSiCl_3$:27 mol, $ClMe_2SiO(Me_2SiO)_{33}SiMe_2Cl$:1 mol, and $MeHSiCl_2$:3 mol were dissolved in toluene solvent, the solution was added dropwise to water to effect a cohydrolysis, the product was washed with water, neutralized by alkali washing and dewatered, and the solvent was then stripped, yielding a hydrosilyl group-containing resin (B1). In this resin, the composition ratio between the constituent siloxane units and a structure represented by $[-SiMe_2O-(Me_2SiO)_{33}-SiMe_2O_{2/2}]$ is represented by the formula: $[PhSiO_{3/2}]_{0.27}[-SiMe_2O-(Me_2SiO)_{33}-SiMe_2O_{2/2}]_{0.01}[MeHSiO_{2/2}]_{0.03}$. The weight-average molecular weight of this resin was 58,000, and the melting point was 58° C.

Examples 1 to 5

Comparative Examples 1 to 3

In each example and each comparative example, the vinyl group-containing resin (A1) of synthesis example 1, the hydrosilyl group-containing resin (B1) of synthesis example 2, the acetylene alcohol-based compound ethynylcyclohexanol as a reaction retarder, an octyl alcohol-modified solution of chloroplatinic acid, a phosphor, and cyclohexanone as a solvent were combined in the amounts shown in Table 1. The thus obtained mixture was stirred thoroughly in a planetary mixer heated at 60° C. to prepare a silicone resin composition, and the composition was then cooled to normal temperature. All of the compositions of the examples and the comparative examples existed in plastic solid states.

Each of the compositions obtained in the manner described above was applied to a fluororesin ETFE film (base film) using a film coater (manufactured by Inoue Kinzoku Kogyo Co., Ltd.), and was then dried at 80° C. for 5 minutes to form a sheet having a thickness of 50 μm. Subsequently, a fluororesin ETFE film (cover film) was adhered to the exposed surface of the resin layer opposite the base film, producing a wavelength conversion sheet having both surfaces protected with ETFE films.

TABLE 1

| | Example 1 | Example 2 | Example 3 | Example 4 | Example 5 | Example 6 | Comparative example 1 | Comparative example 2 | Comparative example 3 |
|---|---|---|---|---|---|---|---|---|---|
| Silicone resin (A1) | 50 | 50 | 50 | 50 | 50 | 50 | 50 | 50 | 50 |
| Silicone resin (B1) | 50 | 50 | 50 | 50 | 50 | 50 | 50 | 50 | 50 |
| Phosphor (YAG-1) | 200 | | 500 | | | | | | |
| Phosphor (YAG-2) | | 1000 | | | 1500 | 2000 | | 2200 | |
| Phosphor (YAG-3) | | | | | | | 200 | | |
| Phosphor (YAG-4) | | | | 300 | | | | | |
| Phosphor (YAG-5) | | | | | | | | | 300 |
| Ethynylcyclohexanol | 0.1 | 0.1 | 0.1 | 0.1 | 0.1 | 0.1 | 0.1 | 0.1 | 0.1 |
| Octyl alcohol-modified solution of chloroplatinic acid | 0.1 | 0.1 | 0.1 | 0.1 | 0.2 | 0.2 | 0.1 | 0.2 | 0.1 |
| Cyclohexanone | 10 | 10 | 10 | 10 | 15 | 10 | 10 | 20 | 10 |

TABLE 2

| Phosphor | Average particle diameter (μm) | Maximum particle diameter (μm) | Average particle diameter/ wavelength conversion layer thickness (%) | Maximum particle diameter/ wavelength conversion layer thickness (%) | Sphericity | Particle size distribution |
|---|---|---|---|---|---|---|
| YAG-1 | 18 | 40 | 36 | 80 | 0.9 | single peak |
| YAG-2 | 18 | 35 | 36 | 70 | 0.8 | 2 peaks |
| YAG-3 | 20 | 40 | 40 | 80 | Granular | |

TABLE 2-continued

| Phosphor | Average particle diameter (μm) | Maximum particle diameter (μm) | Average particle diameter/ wavelength conversion layer thickness (%) | Maximum particle diameter/ wavelength conversion layer thickness (%) | Sphericity | Particle size distribution |
|---|---|---|---|---|---|---|
| YAG-4 | 19 | 40 | 38 | 80 | | 7/3 mixture of YAG-1 and YAG-3 |
| YAG-5 | 35 | 60 | 70 | 120 | 0.9 | |

Examples 7 and 8

In each example, an epoxy resin (TEPIC-S), an acid anhydride (RIKACID MH), an epoxy group-containing silicone resin, an antioxidant (triphenyl phosphite) and a catalyst (2E4MZ) were weighed in the amounts shown in Table 3, placed in a planetary mixer, and mixed and reacted at 80° C. for 10 hours. The resulting reaction product was dissolved in methyl ethyl ketone, and a prescribed amount of a phosphor shown in Table 3 was then added and mixed, yielding a phosphor-containing epoxy resin composition. The compositions of both examples existed in plastic solid states. Details of the materials used are listed below.

Epoxy resin: tris(2,3-epoxypropyl)isocyanurate (product name: TEPIC-S, manufactured by Nissan Chemical Industries, Ltd.)

Acid anhydride: methylhexahydrophthalic anhydride (product name: RIKACID MH, manufactured by New Japan Chemical Co., Ltd.)

Antioxidant: triphenyl phosphite (manufactured by Wako Pure Chemical Industries, Ltd.)

Catalyst: 2-ethyl-4-methylimidazole (2E4MZ, manufactured by Shikoku Corporation)

Each of the obtained compositions was applied to a fluororesin ETFE film (base film) using a film coater (manufactured by Inoue Kinzoku Kogyo Co., Ltd.), and was then dried at 80° C. for 5 minutes to form a sheet having a thickness of 50 μm. Subsequently, a fluororesin ETFE film (cover film) was adhered to the exposed surface of the resin layer opposite the base film, producing a wavelength conversion sheet having both surfaces protected with ETFE films.

TABLE 3

| | Example 7 | Example 8 |
|---|---|---|
| Molar ratio of epoxy groups/ acid anhydride groups | 1.4 | 1.3 |
| Epoxy resin (TEPIC-S) | 45 | 35 |
| Curing agent (RIKACID MH) | 55 | 55 |
| Epoxy group-containing Silicone | | 10 |
| Triphenyl phosphite | 3 | 3 |
| Catalyst (2E4MZ) | 1 | 1 |
| Phosphor YAG-1 | 400 | |
| Phosphor YAG-2 | | 1000 |

For each of the wavelength conversion sheets produced in examples 1 to 8 and comparative examples 1 to 3, the sheet properties in the uncured state and the sheet properties following curing at 150° C. for 30 minutes were investigated, and evaluated against the following criteria. The results are shown in Table 4.

—Uncured State Properties:

The uniformity of the sheet thickness, the uniformity of the internal structure of the sheet, and the external appearance such as the surface smoothness were investigated, and if all of the evaluations were favorable, the sheet was evaluated as "good", whereas if a defect was found in any of the categories, the defect was recorded. The existence of defects was confirmed by visual observation of transmitted light from a microscope.

—Sheet Properties Following Heat Curing:

The tensile strength, the flexural strength, and the elastic modulus were measured in accordance with JIS K 6251.

TABLE 4

| | Example 1 | Example 2 | Example 3 | Example 4 | Example 5 | Example 6 | Example 7 | Example 8 | Comparative example 1 | Comparative example 2 | Comparative example 3 |
|---|---|---|---|---|---|---|---|---|---|---|---|
| Uncured sheet shape | good | good | good | good | good | good | good | good | Voids occurred inside sheet | Sheet formation was impossible | Surface was uneven |
| | | | | | | Cured sheet properties | | | | | |
| Tensile strength (MPa) | 4 | 7 | 4 | 4 | 6 | 7 | | | 4 | — | 4 |
| Flexural strength (N/mm$^2$) | — | — | — | — | — | — | 10 | 12 | — | — | — |
| Elastic modulus (MPa) | 200 | 350 | 260 | 220 | 320 | 400 | 3000 | 3000 | | | |

Example 9

(Encapsulation of LED Element on Ceramic Substrate)

A GaN-based LED element was mounted on a ceramic substrate using the flip-chip method, and the element was bonded to the ceramic substrate using a silicone underfill material containing 60% by mass of silica. Subsequently, each of the wavelength conversion sheets obtained in examples 1, 3 and 5 and comparative example 1 was cut into small chip-size pieces with the release films (namely, the base film and the cover film) still attached. The release film was peeled off one surface of a thus obtained sheet piece, the exposed silicone resin surface was adhered to the LED chip, and the other release film was removed. Next, heating was performed at 150° C. for 5 minutes. The silicone resin sheet on the LED element softened slightly before undergoing curing, thus forming a phosphor-containing resin layer that covered the entire element. Secondary curing was then performed by heating at 150° C. for 60 minutes. In this manner, a light emitting semiconductor (LED) device having a flip-chip structure covered with a phosphor-containing silicone resin layer was obtained. Three of each LED were lit, and the chromaticity was measured using an LED optical properties monitor (product name: LE-3400, manufactured by Otsuka Electronics Co., Ltd.).

Example 10

(Encapsulation of LED Element Mounted Inside Reflector)

In order to enable encapsulation of a GaN-based LED element mounted inside a reflector using the wavelength conversion sheet obtained in example 1, the sheet was first cut into small chip-size pieces with the release films still attached. The LED element was bonded and mounted inside the reflector using a silicone resin die bonding material, and the LED element and the external electrodes were connected with gold wire.

The prepared sheet piece was mounted on the GaN-based LED element so that the phosphor-containing silicone resin contacted the LED chip, and the release film was then removed. Next, heating was performed at 150° C. for 5 minutes, and the silicone resin sheet on the LED element softened slightly to cover the entire element before undergoing curing, thus forming a phosphor-containing resin layer. Secondary curing was then performed by heating at 150° C. for 60 minutes. Subsequently, a transparent encapsulation material (LPS5547, manufactured by Shin-Etsu Chemical Co., Ltd.) was cast onto the reflector, and curing was then performed at 120° C. for 30 minutes and then at 150° C. for one hour, thus completing preparation of a reflector mounted light emitting semiconductor (LED) device. Three of the LEDs were lit, and the chromaticity was measured using an LE-3400.

Comparative Example 4

(Encapsulation of LED Element Mounted Inside Reflector)

A GaN-based LED element was bonded and mounted inside a reflector using a silicone resin die bonding material, and the LED element and the external electrodes were connected with gold wire.

Next, a mixture obtained by uniformly mixing 100 parts by mass of a transparent encapsulation material (LPS5547, manufactured by Shin-Etsu Chemical Co., Ltd.) with 200 parts by mass of the phosphor (YAG-1) used in example 1 was injected onto the structure in an amount sufficient to cover the entire inside of the reflector, and curing was then performed at 60° C. for 30 minutes, subsequently at 120° C. for one hour, and then at 150° C. for one hour, thus completing preparation of a light emitting semiconductor device. Three of the LEDs were lit, and the chromaticity was measured using an LE-3400 manufactured by Otsuka Electronics Co., Ltd.

<Evaluations>

—Dispersion of Phosphor within Light Emitting Semiconductor Device

In order to ascertain the dispersion properties of the phosphor within the light emitting semiconductor device, ten of the reflector mounted LED elements prepared in each of example 10 and comparative example 4 were cut, together with the covering resin layer, and by observation of the resulting cross-section under a microscope, the thickness of the phosphor-dispersed layer within the resin layer formed on the element was measured.

The results revealed that in the case of example 10, which used the wavelength conversion sheet of the present invention, a layer having the phosphor dispersed uniformly therein was formed on the element with a thickness of 48 to 51 μm, whereas in the case of comparative example 4, the precipitation of the phosphor was inadequate, and the phosphor existed across a broad layer from approximately 100 μm above the element, with the density of the phosphor increasing gradually with proximity to the element. The dispersive state of the phosphor was a non-uniform state.

—Measurement of Chromaticity and Brightness

Three of each of the light emitting semiconductor devices prepared in examples 1, 3, 5, 6 and 10 and comparative examples 1 and 4 were lit, and an LE-3400 was used to measure the variation in the chromaticity and the brightness. The results are shown in Table 5.

TABLE 5

|  |  | Example |  |  |  |  | Comparative example |  |
|---|---|---|---|---|---|---|---|---|
|  |  | 1 | 3 | 5 | 6 | 10 | 1 | 4 |
| Variation in chromaticity | u' | 0.001 | 0.001 | 0.001 | 0.001 | 0.001 | 0.008 | 0.009 |
| Brightness | lm/W | 78 | 80 | 81 | 81 | 80 | 69 | 68 |

By using the sheet filled with a large amount of phosphor according to the present invention, a uniform light emitting semiconductor device having no color shift was able to be obtained.

The wavelength conversion sheet of the present invention enables efficient conversion of the light emitted from an LED element, and is useful in the production of light emitting semiconductor devices.

What is claimed is:

1. A wavelength conversion sheet filled with a phosphor, the sheet comprising a layer formed from a heat-curable resin composition, which comprises 100 parts by mass of a resin component and 200 to 2,000 parts by mass of a particulate phosphor in which a proportion of particles having a sphericity of 0.7 to 1.0 is not less than 60% of all particles, and which exists in a plastic solid or semisolid state in an uncured state at normal temperature, wherein:
an average particle diameter of the phosphor is not more than 60% of a thickness of the layer formed from the heat-curable resin composition; and
a maximum particle diameter of the phosphor is not more than 90% of the thickness of the layer formed from the heat-curable resin composition.

2. The wavelength conversion sheet according to claim 1, wherein the heat-curable resin composition is a heat-curable silicone resin composition, a heat-curable epoxy resin composition, or a heat-curable silicone-epoxy hybrid resin composition.

3. The wavelength conversion sheet according to claim 2, wherein the thickness of the layer formed from the heat-curable resin composition is 10 to 100 μm.

4. A method of producing a light emitting optical semiconductor device comprising a covered LED element, the method comprising disposing the wavelength conversion sheet of claim 3 on a surface of an LED element, and curing the sheet by heating, thereby covering the LED element with a phosphor-containing cured resin layer.

5. A light emitting optical semiconductor device comprising a covered LED element, obtained by the method of claim 4.

6. A method of producing a light emitting optical semiconductor device comprising a covered LED element, the method comprising disposing the wavelength conversion sheet of claim 2 on a surface of an LED element, and curing the sheet by heating, thereby covering the LED element with a phosphor-containing cured resin layer.

7. A light emitting optical semiconductor device comprising a covered LED element, obtained by the method of claim 6.

8. The wavelength conversion sheet according to claim 1, wherein the thickness of the layer formed from the heat-curable resin composition is 10 to 100 μm.

9. A method of producing a light emitting optical semiconductor device comprising a covered LED element, the method comprising disposing the wavelength conversion sheet of claim 8 on a surface of an LED element, and curing the sheet by heating, thereby covering the LED element with a phosphor-containing cured resin layer.

10. A light emitting optical semiconductor device comprising a covered LED element, obtained by the method of claim 9.

11. A method of producing a light emitting optical semiconductor device comprising a covered LED element, the method comprising disposing the wavelength conversion sheet of claim 1 on a surface of an LED element, and curing the sheet by heating, thereby covering the LED element with a phosphor-containing cured resin layer.

12. A light emitting optical semiconductor device comprising a covered LED element, obtained by the method of claim 11.

* * * * *